United States Patent [19]

Kyomasu

[11] Patent Number: 4,815,036
[45] Date of Patent: Mar. 21, 1989

[54] PROGRAMMABLE LOGIC ARRAY HAVING AN ON/OFF SENSE FUNCTION

[75] Inventor: Mikio Kyomasu, Hamamatsu, Japan

[73] Assignee: Ricoh Company, Ltd., Tokyo, Japan

[21] Appl. No.: 859,469

[22] Filed: May 5, 1986

Related U.S. Application Data

[63] Continuation-in-part of Ser. No. 630,984, Jul. 16, 1984, abandoned.

[30] Foreign Application Priority Data

Jul. 15, 1983 [JP] Japan .................................. 58-129935

[51] Int. Cl.$^4$ .......................... G11C 7/00; G11C 11/40
[52] U.S. Cl. ...................................... 365/189; 365/196; 365/233; 365/185; 340/825.83; 340/825.87
[58] Field of Search ............... 365/185, 184, 189, 230, 365/195, 104, 205, 207, 208, 233, 196, 227; 307/465, 468; 340/825.83, 825.87, 825.9, 825.91

[56] References Cited

U.S. PATENT DOCUMENTS

| | | | |
|---|---|---|---|
| 4,272,832 | 6/1981 | Ito | 365/233 |
| 4,313,106 | 1/1982 | Hsu | 365/182 |
| 4,503,520 | 3/1985 | Kyomasu et al. | 365/189 |
| 4,508,977 | 4/1985 | Page et al. | 307/468 |
| 4,558,435 | 12/1985 | Hsieh | 365/233 |
| 4,592,028 | 5/1986 | Konishi | 365/189 |

FOREIGN PATENT DOCUMENTS

| | | | |
|---|---|---|---|
| 0208690 | 12/1982 | Japan | 365/233 |
| 8300790 | 10/1983 | Netherlands | 365/104 |

OTHER PUBLICATIONS

Konishi et al., "A 64 Kb CMOS RAM", IEEE Internat. Solid States Circuits Conf., Dig. of Tech. Papers, Feb. 12, 1982, pp. 258–259, 333.

Primary Examiner—Stuart N. Hecker
Assistant Examiner—Glenn A. Gossage
Attorney, Agent, or Firm—Cooper & Dunham

[57] ABSTRACT

A programmable logic array includes a plurality of semiconductor memory elements, such as FAMOSs, arranged in the form of an array and a sense circuit for receiving data out from the memory elements during read out mode. The present programmable logic array is so structured that the sense circuit is rendered operative for a predetermined time period every time when an input signal to the array changes its state thereby allowing to minimize the power consumption.

4 Claims, 4 Drawing Sheets

PROGRAMMABLE LOGIC ARRAY HAVING AN ON/OFF SENSE FUNCTION

CROSS-REFERENCES TO RELATED APPLICATIONS

This is a continuation-in-part of application, Ser. No. 630,984, filed July 16, 1984, now abandoned.

BACKGROUND OF THE INVENTION

1. Field of the Invention

This invention generally relates to a semiconductor device and particularly to a programmable logic array (PLA) or programmable array logic (PAL) having a fixed logic circuit as a part. More specifically, the present invention relates to a reprogrammable or erasable PLA or PAL including a plurality of reprogrammable, non-volatile semiconductor memory elements, such as floating avalanche injection metal oxide semiconductors (FAMOSs) and metal silicon nitride oxide semiconductors (MNOSs).

2. Description of the Prior Art

A typical prior art PLA includes permanently programmable memory elements, such as fusible links and PN junctions, which are permanently programmed by selective thermal destruction. Typically, the bipolar process is used to manufacture prior art PLAs, and, thus, although the prior art PLAs are relatively fast in operation, they suffer from such disadvantages as low density, large power consumption and inability for reprogramming.

Under the circumstances, the present inventor previously proposed a PLA employing reprogrammable, non-volatile semiconductor memory elements as disclosed in U.S. Pat. No. 4,503,520, issued Mar. 5, 1985, and schematically illustrated in FIG. 1. That is, as shown in FIG. 1, the proposed PLA includes a NOR gate comprised by arranging a plurality of FAMOSs 1-1 through 1-n in the form of an array, and programming is carried out by having electrons injected into the floating gates of selected ones of FAMOSs. With this NOR gate as a basic unit, a combinational logic circuit having a desired function may be constructed. In such a PLA, during operation, current in the order of 1 mA flows in a sense circuit 2. This level of current must be maintained even if the sense circuit 2 is optimally designed. Moreover, approximately 36-72 of such a sense circuit 2 are required to be provided in a typical PLA or PAL and thus the level of current ranges between 36 and 72 mA, which is relatively large.

SUMMARY OF THE INVENTION

It is therefore a primary object of the present invention to obviate the disadvantages of the prior art as described above and to provide an improved PLA.

Another object of the present invention is to provide an improved PLA fast in operation and low in power consumption.

A further object of the present invention is to provide an improved reprogrammable PLA including a plurality of reprogrammable or erasable, non-volatile semiconductor memory elements, such as FAMOSs and MNOSs.

Other objects, advantages and novel features of the present invention will become apparent from the following detailed description of the invention when considered in conjunction with the accompanying drawings

DESCRIPTION OF THE PREFERRED EMBODIMENTS

In accordance with the present invention, there is provided a reprogrammable PLA which is so structured to render its sense circuits operative when necessary while keeping them inoperative when unnecessary. In accordance with the preferred embodiment of the present invention, a change in the state of an input signal is detected to produce an activation signal which is then used to render the sense circuits operative for a desired time period. With such a structure, the time period while the sense circuits are held operative may be shortened thereby allowing to minimize power consumption. It is to be noted that in the present specification the terms PLA and PAL will be used interchangeably.

Figure 1:
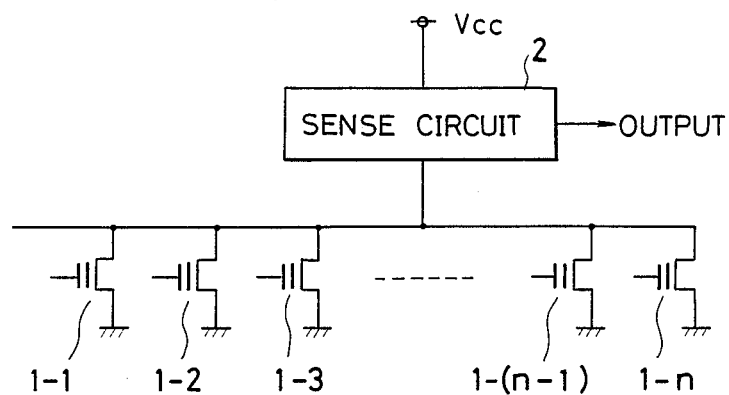
FIG. 1 is a schematic illustration showing a prior art reprogrammable PLA using FAMOSs as memory elements.
Figure 2:
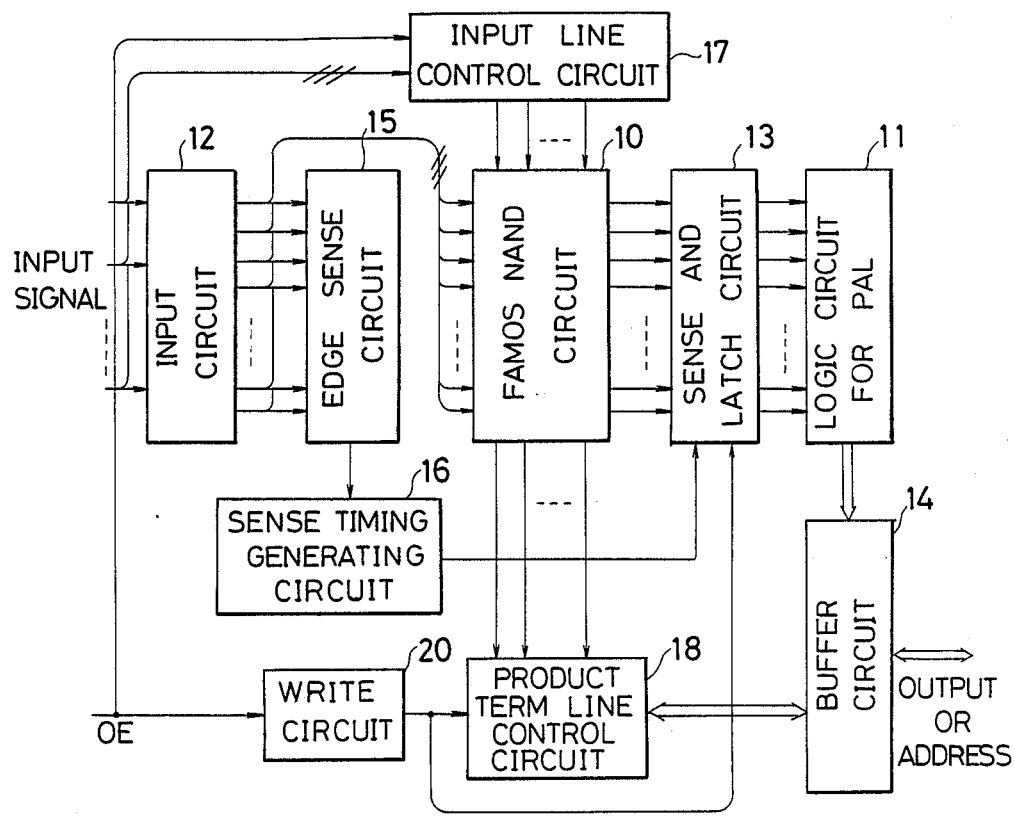
FIG. 2 is a block diagram showing an improved reprogrammable PLA constructed in accordance with one embodiment of the present invention.

Referring now to FIG. 2, there is shown a PAL constructed in accordance with one embodiment of the present invention. The illustrated PAL includes a FAMOS NAND circuit 10 including a plurality of NOR gates comprised of FAMOSs as shown in FIG. 1. The U.S. Pat. No. 4,503,520 as mentioned above discloses as to how a NAND circuit may be defined by NOR gates. The PAL includes a previously determined logic circuit 11 which provides desired functions in combination with the NAND circuit 10. Also provided are an input circuit 12 for selecting an input line or word line, which is connected to the gate of at least one FAMOS transistor in the FAMOS NAND circuit 10, of NAND circuit 10 during read out operation and a sense and latch circuit 13 for reading out data from the NAND circuit 10 and having the thus read out data latched during a read out mode. Only a sense circuit portion will also be designated by 13. Thus, the read out data latched in the circuit 13 is supplied as an output through the logic circuit 11 and a buffer circuit 14 while the system is operating in a read out mode.

Also provided is an edge sense circuit 15 which is connected to receive an output signal from the input circuit 12 to detect the timing of changes in the state of input signal. Connected to receive a detection signal from the edge sense circuit 15 is a sense timing generating circuit 16 which supplies a sense activation signal as its output in response to the detection signal. The operating condition of sense circuit 13 is controlled by the sense activation signal supplied from the sense timing generating circuit 16.

The PAL of FIG. 2 also includes an input line control circuit 17 which includes a decoder for selecting an input line during programming of a selected FAMOS in the NAND circuit 10 and which applies a high voltage to the selected input line. The buffer circuit 14 is structured to be bidirectional and it supplies an address signal to a product term line control circuit 18 during programming of NAND circuit 10. In response to an address signal supplied from the buffer circuit 14, the product term line control circuit 18 selects a product term line of NAND circuit 10 and applies a high voltage to the selected product term line.

It is so connected that a signal OE is applied to the input line control circuit 17 and to a write circuit 20 which is connected to the product term line control circuit 18. The signal OE can take one of three different levels: low level L while being inoperative, high level H during read out mode, and super high level $V_{pp}$, which is higher than high level H, during writing or programming/verify mode, in which data may be programmed in the FAMOS NAND circuit 10 and the data programmed may be verified by reading out the data thus programmed therein. When the signal OE changes to $V_{pp}$ level for programming/verify mode, the write circuit 20 detects this and causes to operate the product term line control circuit 18 during a time period while $V_{pp}$ is being received, thereby keeping the sense circuit 13 in inhibited condition. During the programming/verify mode, or simply programming mode, data to be programmed may be supplied to the FAMOS NAND circuit 10 through the product term line control circuit 18 and the data programmed in the FAMOS NAND circuit 10 may be read out to the buffer circuit 14 also through the product term line control circuit 18.

Therefore, in the read out mode, the product term line control circuit 18 is set inoperative and the data may be read out of the FAMOS NAND circuit 10 to the buffer circuit 14 through the sense circuit 13. On the other hand, in the programming/verify mode, the sense circuit 13 is set inoperative and supply of data to and read out of data from the FAMOS NAND circuit 10 is carried out through the product term line control circuit 18.

Figure 3:
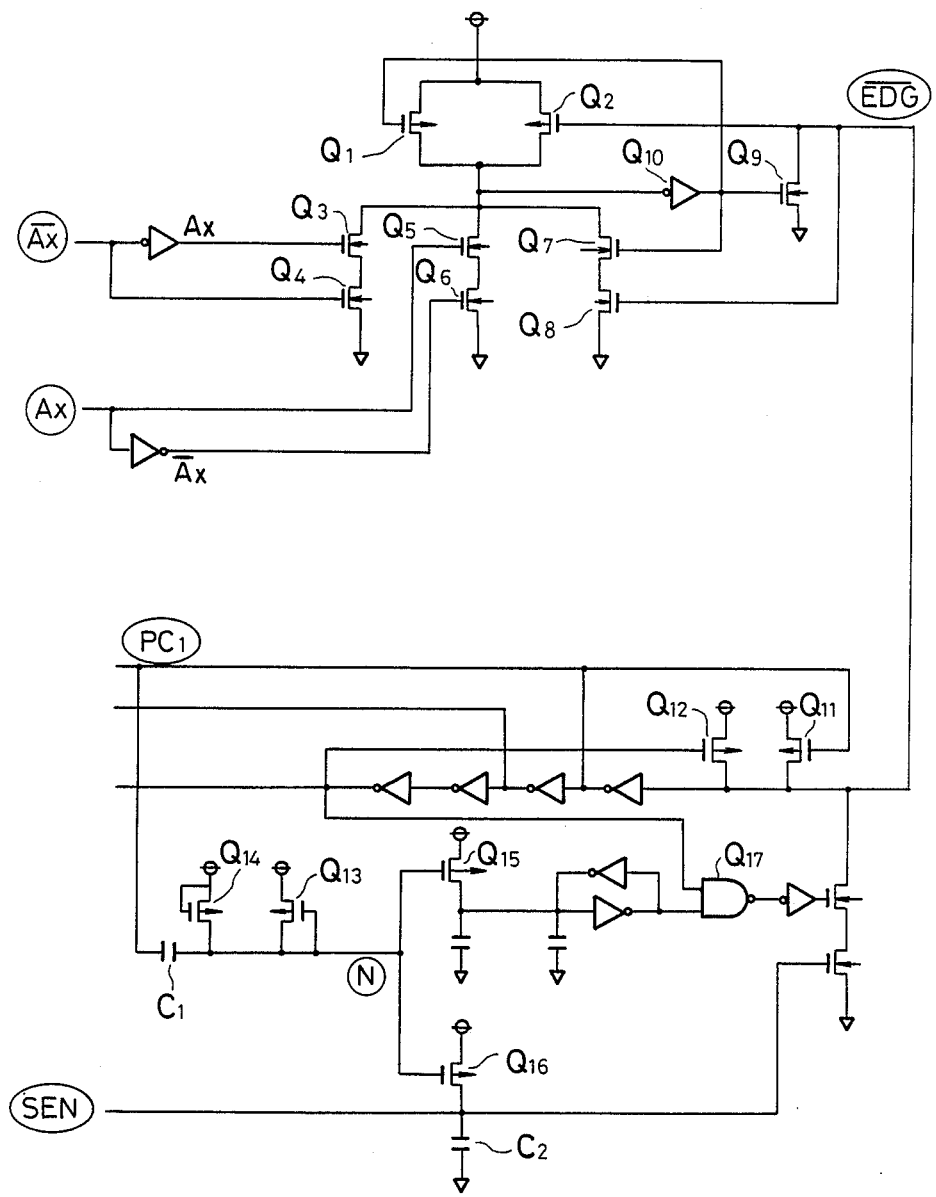
FIG. 3 is a circuit diagram showing a detailed structure of the edge sense and sense timing generating circuits provided in the structure of FIG. 2.
Figure 4:
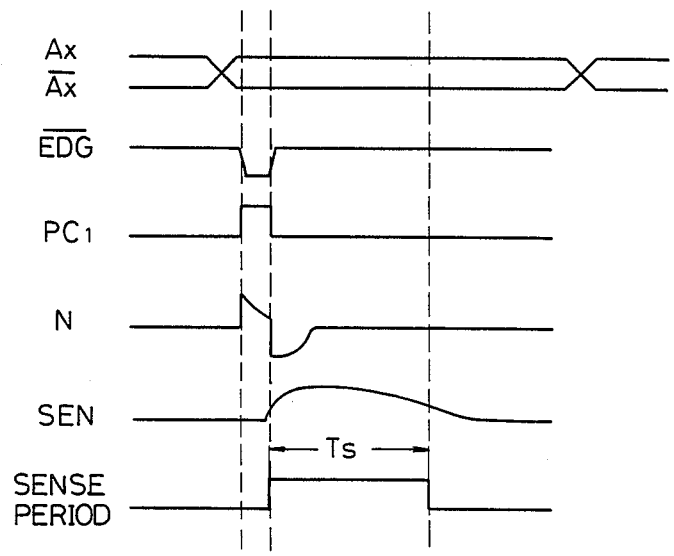
FIG. 4 is a timing chart showing several wave forms which are useful for understanding the operation of the structure shown in FIG. 3.

Now, the edge sense circuit 15 and sense timing generating circuit 16 will be described more in detail with reference to FIGS. 3 and 4. As shown in FIG. 3, the edge sense circuit 15 includes a pair of series-connected N-channel MOS transistors Q3 and Q4 and another pair of series-connected N-channel MOS transistors Q5 and Q6, which are connected to receive a signal Ax and its inverted signal $\overline{Ax}$ as supplied from the input circuit 12. As shown in FIG. 4, when the signal Ax changes its state, the edge sense circuit 15 of FIG. 3 supplies an edge signal $\overline{EDG}$ as its output. That is, when an address signal goes high, the transistors Q5 and Q6 are turned on, which then causes an inverter Q10 to supply a high level output, which, in turn, causes a transistor Q9 to be turned on so that the $\overline{EDG}$ signal goes low. Under the condition, N-channel MOS transistors Q7 and Q8 remain turned on until the $\overline{EDG}$ signal becomes high level sufficiently so that the $\overline{EDG}$ signal is maintained at low level for a desired time period. P-channel MOS transistors Q11 and Q12 are provided to determine the high level of $\overline{EDG}$ signal and to steepen the rising slope of $\overline{EDG}$ signal. This $\overline{EDG}$ signal is used to set a sense time period or the interval of sense activation signal.

The $\overline{EDG}$ signal is inverted by an inverter to produce a signal PC1 which is capacitively coupled to a node N thereby producing a signal N, as shown in FIG. 4. While the signal N is at low level, a P-channel MOS transistor Q16 remains turned on thereby having a capacitor C2 charged so that a signal SEN goes high. The transistor Q16 is turned off when the signal N returns to the original level, and the signal SEN gradually decreases its level. The level of signal SEN is compared with a predetermined constant level to determine the length of sense time period $T_s$.

Figure 5:
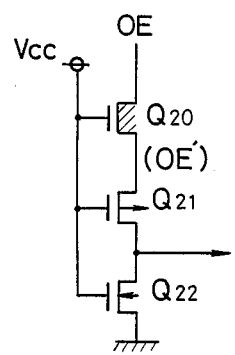
FIG. 5 is a circuit diagram showing a detailed structure of the write circuit provided in the structure of FIG. 2.
Figure 6:
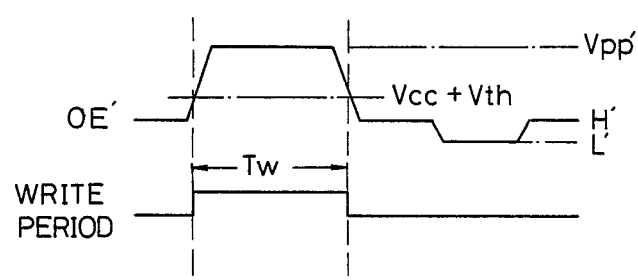
FIG. 6 is a timing chart snowing wave forms which are useful for understanding the operation of the structure shown in FIG. 5.

A detailed structure of write circuit 20 is shown in FIG. 5. The write circuit 20 includes a depletion type N-channel MOS transistor Q20 as a load and a pair of enhancement type P-channel and N-channel MOS transistors Q21 and Q22, respectively, which are connected to define a CMOS structure. The signal OE is applied to the source of transistor Q20 and a reference voltage $V_{cc}$ is applied to the gate of each of the transistors Q20–Q22. An output signal from the write circuit 20 shown in FIG. 5 is taken out of a junction between the transistors Q21 and Q22. In this circuit, with a signal appearing at the source of transistor Q21 when the signal OE is applied to the transistor Q20 being designated by OE' and its signal level being designated by $V_{pp}'$, H' and L' corresponding to $V_{pp}$, H and L for signal OE, it is so structured that $V_{cc}+V_{th}$ (where, $V_{th}$ is a threshold voltage of transistor Q21) ranges between $V_{pp}'$ and H'. Accordingly, if the signal OE becomes $V_{pp}$ level during programming, both of the transistors Q21 and Q22 are turned on, whereby the output signal from the write circuit 20 becomes high during a time period Tw which depends on a ratio between on-resistances of transistors Q21 and Q22. On the other hand, if the signal OE is either high or low, the transistor Q21 is off and the transistor Q22 is on so that the output signal becomes low level.

With the foregoing in mind, the operation of the embodiment shown in FIG. 2 will be described below. First, it will be assumed that the NAND circuit 10 has already been programmed and a read out operation from the NAND circuit 10 is to be carried out. The signal OE changes from low level to high level, thereby establishing the read out mode, and an input signal is applied to the input circuit 12. In this case, no output is supplied from the write circuit 20 so that the sense circuit 13 is not set in inhibited state and the product term line control circuit 18 is not rendered operative. At the NAND circuit 10, an input line is selected by a decoder signal from the input circuit 12. The edge sense circuit 15 detects the timing in change of state of a signal from the decoder signal. Then, on the basis of the timing thus detected, the sense timing generating circuit 16 causes the sense circuit 13 to be rendered operative for a time period $T_s$. As a result, current is allowed to flow in the sense circuit 13 only for the time period $T_s$ during which the sense circuit 13 is rendered operative by a sense activation signal supplied from the sense timing generating circuit 16. Thus, in the read out mode, the product term line control circuit 18 is kept disabled responsive to a signal from the write circuit 20 and the sense circuit 13 is enabled for a predetermined time period every time is receives a signal from the sense timing generating circuit 16.

In the case where programming is to be carried out for the first time for the NAND circuit 10 or the program stored in the NAND circuit 10 is to be altered, the signal OE is set at $V_{pp}$ level, thereby establishing the programming/verify mode. Thus, when the write circuit 20 detects the $V_{pp}$ level, it supplies an output signal thereby rendering the product term line control circuit 18 operative and setting the sense circuit 13 in inhibited state. Upon receipt of the input signal and the OE signal at $V_{pp}$ level, the input line control circuit 17 applies a high voltage to a selected input line of NAND circuit 10. On the other hand, upon receipt of an address signal from the buffer circuit 14 and the OE signal at $V_{pp}$ level, the product term line control circuit 18 applies a high voltage to a selected product term line of NAND circuit 10. As a result, electrons are injected into the floating gate of a FAMOS located at a cross-over point between the selected input line and product term line to carry out programming. Thus, in the programming-/verify mode, the sense circuit 13 is kept disabled or set in the inhibited state in accordance with a signal from the write circuit 20, and, at the same time, the product term line control circuit 18 is enabled in accordance with the signal from the write circuit 20.

It is to be noted that the present embodiment is fabricated by a CMOS process so that the level of power consumption is much lower than the case in which a bipolar, NMOS or PMOS process is employed. Further, in the embodiment illustrated in FIG. 2, the input circuit 12 for read out is provided separately from the input line control circuit 17 for programming. Because of this, a structure from the input circuit 12 for read out to the buffer circuit 14 is greatly simplified, which provides an advantage of making the read out speed faster. For example, in the case where the present embodiment is constructed using a 2-2.5 micron fabrication process, a high speed operation in the order of 40-60 ns can be expected, which is comparable in speed to a PAL fabricated by a bipolar process.

Figure 7:
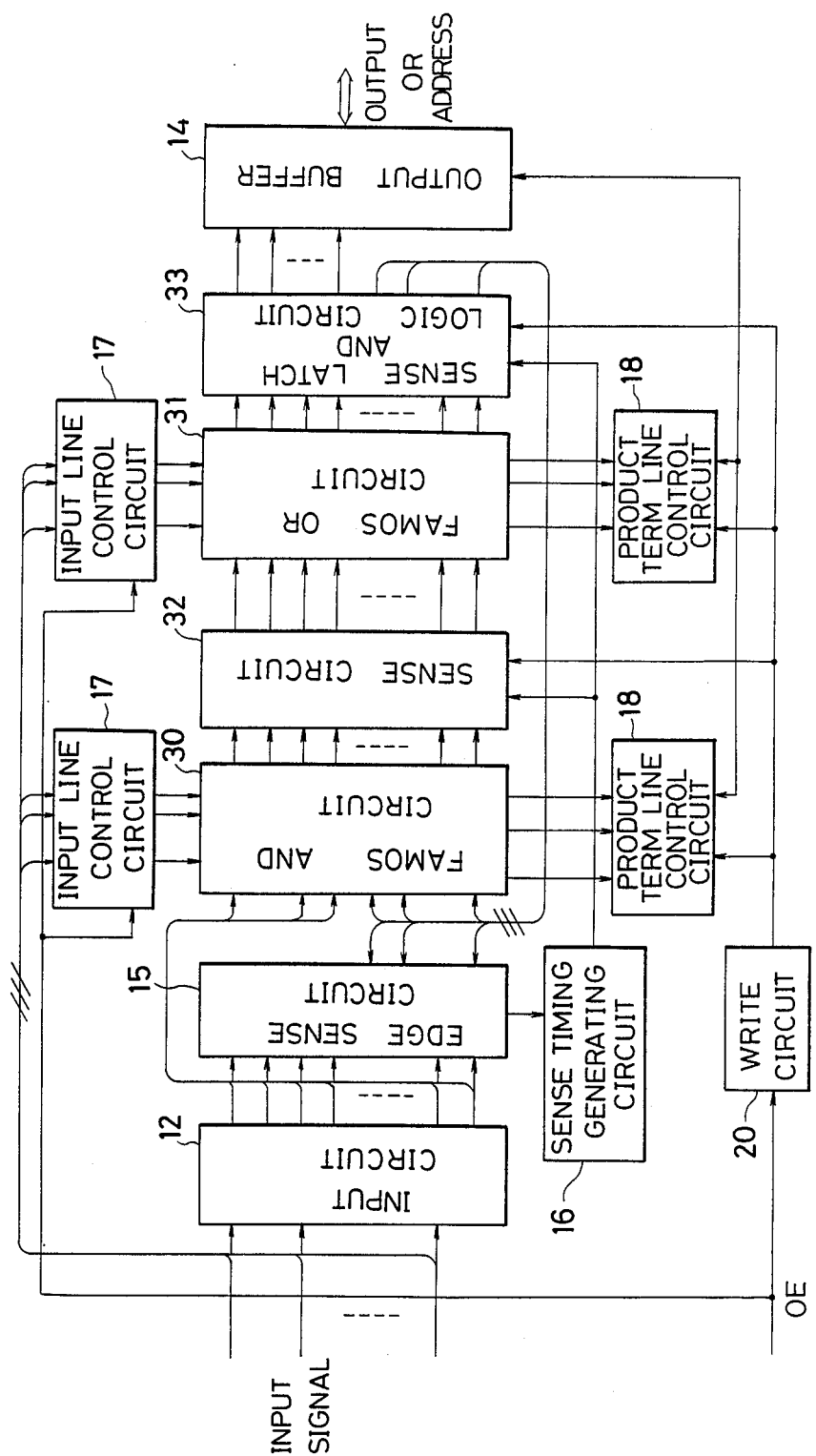
FIG. 7 is a block diagram showing another embodiment of the present invention.

FIG. 7 shows an example when the present invention is applied to a PLA. A major difference from the embodiment shown in FIG. 2 resides in the provision of an AND circuit 30 and an OR circuit 31, which are both constructed on the basis of NOR gates employing FAMOSs and thus reprogrammable. Between the AND circuit 30 and the OR circuit 31 is provided a sense circuit 32. A sense and latch circuit 33 for sensing an output from the OR circuit 31 is provided with a logic circuit for supplying a feed-back to the AND circuit 30. In the embodiment illustrated in FIG. 7 also, the operation of each of the sense circuits 32 and 33 is controlled by the edge sense circuit 15 and the sense timing generating circuit 16. Similarly with the embodiment of FIG. 2, this embodiment is also fabricated by a CMOS process so that an advantage of low power consumption is attained. Also similarly with the embodiment of FIG. 2, since the input circuit 12 for read out is provided separately from the input line control circuit 17 for programming, there is obtained an advantage of high speed operation.

In the above-described embodiments, the provision is made of edge sense circuit 15 and sense timing generating circuit 16 for producing a sense activation signal. It should be noted however that various other modifications may be made as long as such a sense activation signal is generated and supplied to the sense circuit for limited activation thereof. It should further be noted that the write circuit 20 is not limited to the structure shown in FIG. 5 and it may take any other form as long as it can detect the presence of high voltage. For example, the write circuit 20 may be constructed by an inverter circuit whose driver transistor is structured to have a desired threshold voltage. Furthermore, any other reprogrammable semiconductor memory elements, such as MNOSs, than FAMOSs in the above-described embodiments may be used in the present invention.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A programmable logic array comprising:
   a storing means for storing a program having a desired logic function, said storing means including a plurality of reprogrammable, non-volatile semiconductor memory elements arranged in the form of a matrix defined by input lines and product term lines;
   an input circuit connected to said storing means for supplying a selection signal to said input lines in response to an input signal supplied thereto;
   edge sensing means connected to receive an output from said input circuit for detecting a timing of change of state of said input signal;
   sensing means connecting to receive an output from said storing means; and
   sense timing generating means connected between said edge sensing means and said sensing means for generating and supplying a sense activation signal to said sensing means to enable said sensing means for a predetermined time period upon detection of a timing of change of state of said input signal by said edge sensing means.

2. The programmable logic array of claim 1 wherein said plurality of memory elements are arranged in the form of NAND gates.

3. The programmable logic array of claim 1 further comprising product term line selecting means for selecting one of said product term lines in response to a control signal.

4. The programmable logic array of claim 3 further comprising a write circuit connected to said sensing means and said product term line selecting means, said write circuit causing said sensing means to be inhibited and said product term line selecting means to be operative when said array is in a programming mode; whereas, said write circuit causes said sensing means to be non-inhibited and said product term line selecting means to be inoperative when said array is in a read mode.

* * * * *